US012370487B2

(12) United States Patent
Tsao et al.

(10) Patent No.: US 12,370,487 B2
(45) Date of Patent: Jul. 29, 2025

(54) PARTICULATE MATTER FILTRATION APPARATUS AND METHOD THEREOF

(71) Applicant: TAIWAN SEMICONDUCTOR MANUFACTURING COMPANY LTD., Hsinchu (TW)

(72) Inventors: Chih-Ming Tsao, Miaoli County (TW); Kuo-Cheng Huang, Miaoli County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 603 days.

(21) Appl. No.: 17/587,205

(22) Filed: Jan. 28, 2022

(65) Prior Publication Data

US 2023/0035254 A1 Feb. 2, 2023

Related U.S. Application Data

(60) Provisional application No. 63/227,798, filed on Jul. 30, 2021.

(51) Int. Cl.
*B01D 47/06* (2006.01)
*B01D 47/05* (2006.01)
*H01L 21/67* (2006.01)

(52) U.S. Cl.
CPC ............. *B01D 47/06* (2013.01); *B01D 47/05* (2013.01); *H01L 21/67017* (2013.01)

(58) Field of Classification Search
CPC ........ B01D 47/06; B01D 47/05; B01D 45/08; H01L 21/67017; H01L 2224/02377; H01L 2224/02379; B01F 25/10; F24F 3/167; Y02B 30/70
USPC .......................................................... 95/213
See application file for complete search history.

(56) References Cited

U.S. PATENT DOCUMENTS

2002/0179283 A1* 12/2002 Suenaga ............... F24F 5/0007 165/58
2006/0202365 A1* 9/2006 Cluchey .................... F24F 6/12 261/DIG. 65
2008/0260625 A1* 10/2008 Kogoi .................. H01G 9/2031 423/610

FOREIGN PATENT DOCUMENTS

CN 105509165 B * 8/2018
CN 106677777 B * 3/2019

* cited by examiner

*Primary Examiner* — Qianping He
(74) *Attorney, Agent, or Firm* — WPAT LAW; Anthony King

(57) ABSTRACT

A system includes a semiconductor apparatus configured to process a workpiece, a mist generator configured to generate a mist and a particle separator configured to receive an exhaust gas generated by the semiconductor apparatus. The particle separator includes a first fan, wherein the first fan includes a plurality of blades. Each of the plurality of blades includes holes allowing the exhaust gas and the mist to pass through.

20 Claims, 15 Drawing Sheets

700 ↙

702 — Process a workpiece in a semiconductor apparatus

704 — Exhaust the exhaust gas from the semiconductor apparatus to a particle separator 706 — Dispense a mist into the central chamber to mix with the exhaust gas 708 — Rotate the first fan while dispensing the mist to permit mixing of the exhaust gas with the mist between the central chamber and a perimeter of the particle separator

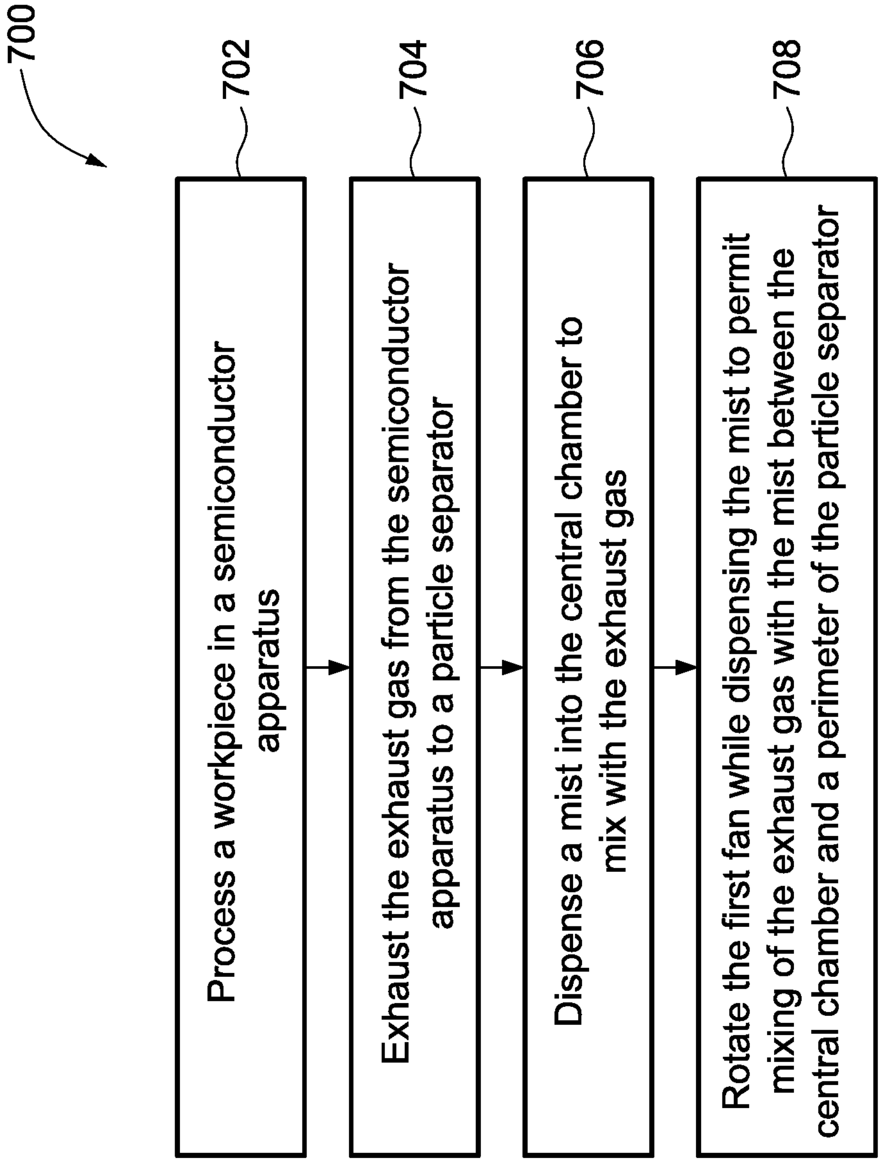

FIG. 11

PARTICULATE MATTER FILTRATION APPARATUS AND METHOD THEREOF

PRIORITY CLAIM AND CROSS-REFERENCE

This application claims priority to U.S. Provisional Application No. 63/227,798 filed Jul. 30, 2021, the disclosure of which is hereby incorporated by reference in its entirety.

BACKGROUND

The manufacturing of semiconductor integrated circuits with an increased device density and enhanced circuit functionalities is becoming increasingly complicated. Further, the manufacturing of the integrated circuits is usually performed along with generation of polluting by-products, which may cause concerns of environmental pollution. Among the various kinds of pollutants, particulate matter (PM) is considered an important source of air pollution and has drawn a great deal of attention in recent years. PM is usually found in an exhaust gas generated during a semiconductor processing step or in an exhaust cleaning step. Although the existing exhaust PM filtration techniques have gained significant progress, there are still many aspects left to be addressed, e.g., continuing reduction of the PM mass concentration, in order to meet the more stringent air pollution control requirements.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 11 shows a flowchart of a particle filtration method, in accordance with some embodiments.

DETAILED DESCRIPTION

Figure 1:
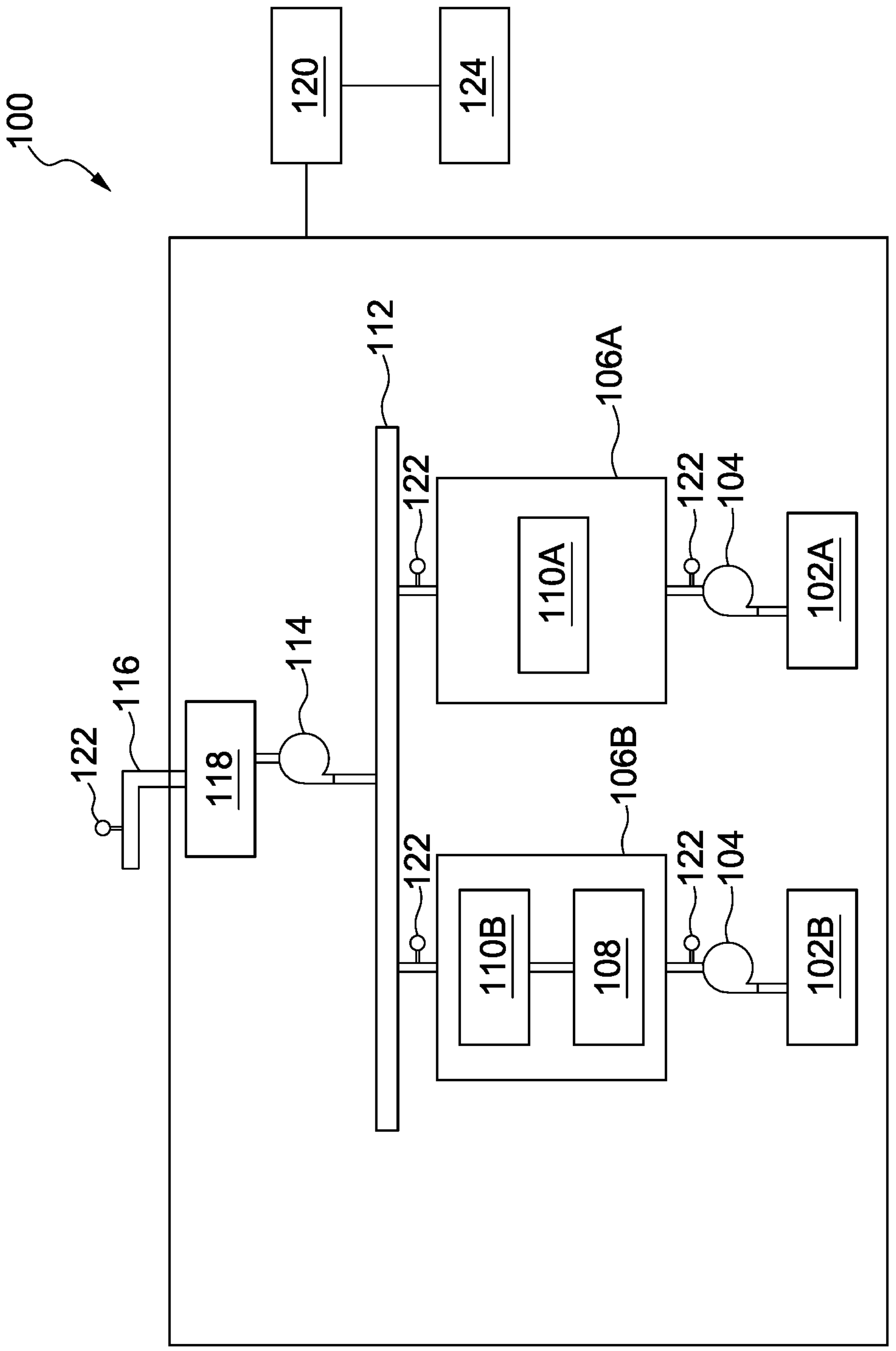
FIG. 1 is a block diagram of a semiconductor fabrication system, according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the deviation normally found in the respective testing measurements. Also, as used herein, the terms "about," "substantial" or "substantially" generally mean within 10%, 5%, 1% or 0.5% of a given value or range. Alternatively, the terms "about," "substantial" or "substantially" mean within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "about," "substantial" or "substantially." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

The terms "couple," "coupled" and "coupling" used throughout the present disclosure describe the direct or indirect connections between two or more devices or elements. In some cases, a coupling between at least two devices or elements refers to mere electrical or conductive connections between them and intervening features may be present between the coupled devices and elements. In some other cases, a coupling between at least two devices or elements may involve physical contact and/or electrical connections.

The present disclosure relates generally to an exhaust cleaning system, and particularly to a particle filtration system associated with a semiconductor process exhaust. The process exhaust, or flue gas, generated during a semiconductor processing step usually contains pollutants, and thus one or more pollutant filtration processes are needed before the process gas is discharged out of the semiconductor fabrication facility. In the present disclosure, a particulate matter (PM) filtration apparatus is introduced to aid in reducing, the PM mass concentration left in the flue gas, in which the flue gas is introduced to a rotary particle separator and mixed with liquid droplets in a fluid mist. The agglomeration process of the PM particles with the mist droplets is strengthened by help of the rotary particle separator, and thus the PM particles can be captured to form enlarged PM particles. The mist-mixed PM particles therefore have a greater particle size and can be separated more easily, and thus the performance of PM filtration can thus be improved.

FIG. 1 is a block diagram of a semiconductor fabrication system 100, according to some embodiments of the present disclosure. In the depicted example, the semiconductor fabrication system 100 is a semiconductor fabrication facility for producing semiconductor devices. In some other cases, the semiconductor fabrication system 100 can be any other kinds of facilities or equipment that generate exhaust gas or flue gas. The semiconductor fabrication system 100 may include one or more semiconductor tools 102, one or more pumps 104, one or more exhaust gas cleaning apparatus 106, e.g., 106A and 106B, an exhaust duct 112, a pump 114, and an exhaust outlet 116. One or more apparatus can be incorporated into the semiconductor fabrication system 100 but are omitted in the depicted embodiment for clarity. In some embodiments, the semiconductor fabrication system 100 includes more than one floor, and the previously mentioned equipment or devices are arranged in different floors and coupled together.

The semiconductor tool 102 is used to perform one or more semiconductor processing steps on workpieces, e.g., semiconductor wafers, for fabricating semiconductor devices. The operation type of the semiconductor processing steps include, but are not limited to, cleaning, etching, deposition, oxidation, implantation, annealing, baking, exposure, bonding, or the like. In some embodiments, during operation, one or more reacting materials or catalyst materials are introduced into the semiconductor tool 102 for performing the processing steps as desired. In some cases, exhaust gas is generated during the semiconductor processing steps. The exhaust gas of the semiconductor tool 102 is discharged to the exhaust gas cleaning apparatus 106 via the corresponding pump 104. The exhaust gas of the semiconductor tool 102 may include pollutants that need to be filtered before being discharged to the atmosphere outside the semiconductor fabrication system 100, e.g., $PM_{10}$, $PM_{2.5}$.

The pumps 104 are arranged between outlets of the semiconductor tools 102 and inlets of the corresponding exhaust gas cleaning apparatus 106. The pumps 104 are configured to pump out the exhaust gas generated by the semiconductor tool 102 during one or more semiconductor processing steps and direct the exhaust gas into the gas cleaning apparatus 106. In some embodiments, the pump 104 includes a dynamic type of pump, e.g., a centrifugal pump, a vertical centrifugal pump, a horizontal centrifugal pump, and the like, and a positive-displacement type pump, e.g., a diaphragm pump, a gear pump, a peristaltic pump, and the like. In some embodiments, the pump 104 includes a draft fan and include any suitable type of the draft fan, such as a centrifugal fan, an axial fan, a mixed-flow fan, or the like.

The exhaust gas cleaning apparatus 106 are configured to filter the exhaust gas generated by the semiconductor tools 102. The exhaust gas cleaning apparatus 106 may include particle separators, which are used alone or combined with other modules according to different applications. For example, a first type exhaust gas cleaning apparatus 106A includes a particle separator 110A that is responsible for filtering the particles by separating the particles or other solids from the exhaust gas generated by the semiconductor tool 102A. In some embodiments, the first type exhaust gas cleaning apparatus 106A is more suitable where the toxic substances in the exhaust gas generated by the semiconductor tool 102A are absent or pre-cleaned.

In another example, a second type exhaust gas cleaning apparatus 106B is formed of a scrubber 108 and a particle separator 110B to perform two-stage pollutant treatment on the exhaust gas. The treatment of the scrubber 108 may generate various kinds of residues after exhaust treatment, including PM of different particle sizes. The particle separator 110B is used to capture and filter the residual particles left by the scrubber 108.

In some embodiments, the scrubber 108 includes a wet scrubber, a semi-dry scrubber, a dry scrubber, or the like. The scrubber 108 may be used to remove or neutralize toxic or corrosive gas (e.g., acid or alkaline gas) by exposing the exhaust gas to a scrubber solution contained in the scrubber 108. The scrubber solution may include water or other neutralizing liquids and are sprayed out to thereby cool the exhaust gas and/or adjust the pH value of the exhaust gas. In some embodiments, the scrubber solution that is used for cooling the exhaust gas in the scrubber 108 may be evaporated by the high-temperature exhaust gas, condensed with the particles and discharged. Since the scrubber 108 is focused on controlling the temperature or pH level of the exhaust gas within an acceptable range, the performance of particle filtration of the scrubber 108 may not be satisfactory. In this connection, the particle separator 110B serve to improve the performance of particle filtration for the exhaust gas discharged by the scrubber 108.

The exhaust gas discharged by the exhaust gas cleaning apparatus 106 flows into the exhaust duct 112. The exhaust gases corning from different instances of semiconductor tools 102 deployed in the semiconductor fabrication system 100 are exhausted to the atmosphere through an exhaust outlet 116 and a pump 114. The exhaust duct 112 may be formed of a main piping that is in fluid communication with a plurality of exhaust gas cleaning apparatus 106. In alternative embodiments, the exhaust duct 112 includes a piping network formed of a main piping and branch pipes to extend its coverage across the semiconductor fabrication system 100 and to be in fluid communication with the exhaust gas cleaning apparatus 106 across different locations of the semiconductor fabrication system 100. In some embodiments, the pumping power of the exhaust outlet 116 is greater than that of the pump 104, e.g., the pump 114 has a pumping power of 20 to 100 times of the pumping power of each of the pumps 104. In some embodiments, more than one pump 114 is deployed in the piping network of the exhaust duct 112 to ensure a sufficient pumping force for the discharge of the exhaust gas.

In some embodiments, the semiconductor fabrication system 100 further includes a scrubber 118 arranged between the exhaust duct 112 the exhaust outlet 116. The scrubber 118 may be configured to perform the final stage of exhaust gas cleaning before the exhaust gas is discharged out of the semiconductor fabrication system 100. The configuration of the scrubber 118 may be similar to the scrubber 108; however, the processing capacity of exhaust gas of the scrubber 118 is greater than the scrubber 108 used in each of the exhaust gas cleaning apparatus 106. By help of the scrubber 118, the total pollutant mass concentration in the exhaust gas can be further decreased.

In some embodiments, the semiconductor fabrication system 100 further includes a plurality of sensors 122 configured to perform data sensing for the exhaust gas filtration process. The sensors 122 may include various kinds of monitors arranged at the outlets of the semiconductor tools 102 and configured to monitor the operations of the exhaust gas cleaning apparatus 106. In some examples, the sensors 122 are configured as flow rate sensors arranged at the outlets of the semiconductor tools 102 or the pumps 104 or the exhaust outlet 116 and configured to monitor the flow rate of the fluid pumped by the pumps 104 or the pump 114, or the exhaust gas cleaning apparatus 106. The flow rate sensors may also be arranged at the inlets of the pumps 104 or the exhaust outlet 116. In some other examples, the sensors 122 may include humidity sensors configured to monitor a liquid concentration of the exhaust gas or the weather humidity data in the surroundings of the semiconductor fabrication system 100. The sensors 122 may also include various kinds of pollutant sensors arranged at the outlets of the semiconductor tools 102 and configured to detect the pollutant mass concentrations in the exhaust gas in different stages of the exhaust gas filtration process.

In some embodiments, the semiconductor fabrication system 100 further includes a processor 120 configured to receive the sensing data provided by the sensors 122, analyze these sensing data and control the operations of the exhaust gas cleaning apparatus 106 or other the parts of the semiconductor fabrication system 100, e.g., the rotation speed of the first fan 212 or the second fan 214, and the flow rate of the fluid mist generated by the mist generator 206 or the mist dispenser 306. The processor 120 may be connected to the sensors 122 through a wired connection network or in a wireless manner. In some embodiments, the processor 120 is configured to store the sensing data in a database 124. In some embodiments, the database 124 further stores various kinds of historical process data, e.g., from a fault detection and analysis module, that may be relied on by the processor 120 in analyzing the performance of the exhaust gas cleaning apparatus 106, e.g., an operation type performed by the semiconductor tool 102, a material list associated with the operations performed by the semiconductor tool 102, an operation recipe of the operations performed by the semiconductor tool 102, a list of pollutants generated during the operations, a mapping between operation parameters of the exhaust gas cleaning apparatus 106 and the corresponding operations, an operation recipe of the operation type, a particle mass concentration of the exhaust gas, or the like. In some embodiments, the database 124 receives and provides various kinds of real-time environment data that may be relied on by the processor 120 in analyzing the pollutant control performance, e.g., weather forecast data or air condition forecast data in an environment outside the semiconductor fabrication system 100.

In some embodiments, the processor 120 is configured to load algorithms to conduct pollutant control analysis based on the previously mentioned sensing data, process data or environment data. The algorithms may include artificial intelligent analysis techniques, datamining techniques or an artificial neural network. The cooperation of the big data and artificial intelligence techniques may aid in increasing the analysis accuracy and stability and improve the control performance of the processor 120 to achieve an efficient, and accurate and pollutant control framework.

Figure 2:
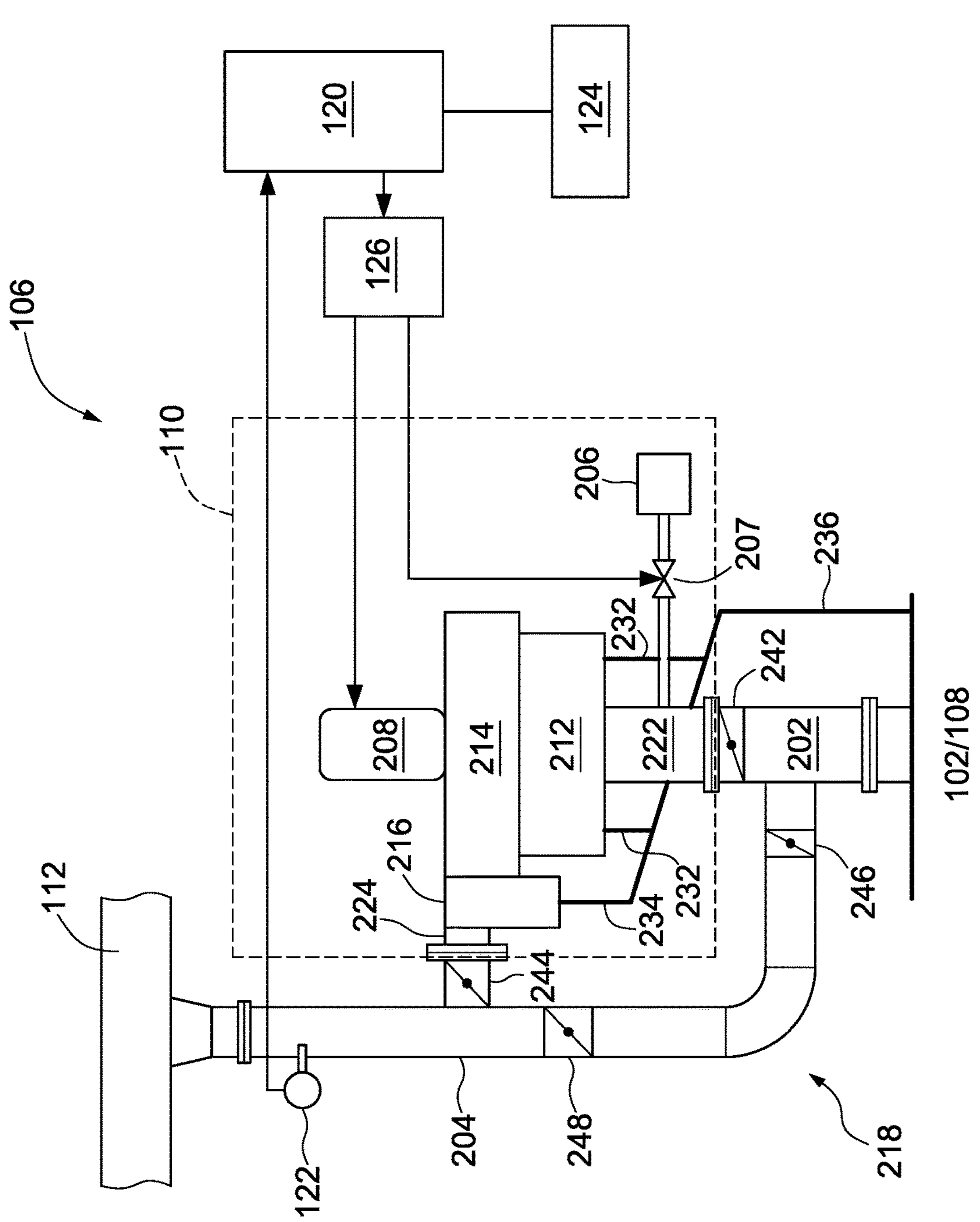
FIG. 2 is a block diagram of a portion of an exhaust gas cleaning apparatus, in accordance with some embodiments of the present disclosure.

FIG. 2 is a block diagram of a portion of the exhaust gas cleaning apparatus 106, in accordance with some embodiments of the present disclosure. FIG. 2 illustrates that the exhaust gas cleaning apparatus 106 includes a particle separator 110, an exhaust gas inlet 202, an exhaust gas outlet 204, and a bypass duct 218. The exhaust gas inlet 202 is in fluid communication with at least one of the semiconductor tool 102 and the scrubber 108. The exhaust gas outlet 204 is in fluid communication with the exhaust duct 112.

In some embodiments, the particle separator 110 includes a mist generator 206, a motor 208, a first fan 212, a second fan 214 and a hopper 216. During operation, the exhaust gas (labelled as "EG" shown in FIG. 3) generated by the semiconductor tool 102 or the scrubber 108 is directed into the exhaust gas inlet 202, through the particle separator 110, e.g., the first fan 212, the second fan 214 and the hopper 216, and reaches the exhaust gas outlet 204. In some embodiments, the particle separator 110 includes an input channel 222 connecting the first fan 212 to the exhaust gas inlet 202. In some embodiments, the particle separator 110 includes an output channel 224 connecting the hopper 216 to the exhaust gas outlet 204. The particle separator 110 may further include an inlet valve 242 arranged between the exhaust gas inlet 202 and the input channel 222 and an outlet valve 244 arranged between the exhaust gas outlet 204 and the output channel 224, in which the inlet valve 242 and the outlet value 244 are used to switch the exhaust gas inlet 202 and the exhaust gas outlet 204, respectively.

The mist generator 206 is configured to generate a beam of fluid mist, or simply a beam of mist, which is to be mixed with the exhaust gas in the first fan 212. The fluid mist may facilitate the agglomeration process of the particles, e.g., the PM, in the exhaust gas and improve the performance of separating the particles from the exhaust gas. The particle separator 110 may further include a valve 207 configured to switch the dispensing of the fluid mist generated by the mist generator 206. In some embodiments, the particle separator 110 further include drainpipes 232 at a bottom side of the first fan 212, in which the drainpipes 232 are configured to drain the fluid condensed from the fluid mist.

The hopper 216 is configured to filter the exhaust gas at the output of the second fan 212. The hopper 216 may include a liquid solution to facilitate capturing of liquid droplets along with PM residues left in the exhaust gas in case such solid and liquid residues are not completely filtered by the second fan 212, and the hopper 216 may thus improve the performance of the particle separator 110. The particle separator 110 may further include a drainpipe 234 at a bottom side of the hopper 216, in which the drainpipe 234 is configured to drain the liquid solution out of the hopper 216. The drainpipes 232 and 234 may be connected to a main drainpipe 236 and the condensed liquids are drained out of the particle separator 110 through the main drainpipe 236.

The bypass duct 218 is in fluid communication with the exhaust gas inlet 202 and the exhaust gas outlet 204. The bypass duct 218 may permit the exhaust gas to flow through when the particle separator 110 is subject to an examination work or maintenance routines. The bypass duct 218 may include a bypass inlet valve 246 and a bypass outlet valve 248 used to switch the bypass duct 218. In some embodiments, the bypass duct 218 is not equipped with exhaust gas cleaning functions and only allows the exhaust gas to bypass the particle separator 110. Although not illustrated, each of the bypass ducts 218 may be in fluid communication with another exhaust gas cleaning apparatus 106 or particle separator 110 of the semiconductor fabrication system 100. As a result, the exhaust gas cleaning operation of one particle separator 110 can be taken care of by another particle separator 110, such that the individual particle separators 310 can receive examination or maintenance work without compromising the exhaust gas cleaning performance. In some embodiments, the bypass duct 218, the exhaust gas inlet 202 and exhaust gas outlet 204 are included in the particle separator 110.

As illustrated in FIG. 2, the sensor 122, the valve 207 and the motor 208 connect to the processor 120. In some embodiments, the exhaust gas cleaning apparatus 106 further includes a controller 126 configured to control the operations of the valve 207 and the motor 208. The controller 126 may include a programmed logic controller to control the flow rate of the fluid mist or the rotation speed of the first fan 212 or the second fan 214 through controlling the driving power of the motor 208. In some embodiments, the exhaust gas cleaning apparatus 106 further includes a variable frequency drive configured to control the rotation speed of the motor 208 through the commands of the controller 126.

Figure 3:
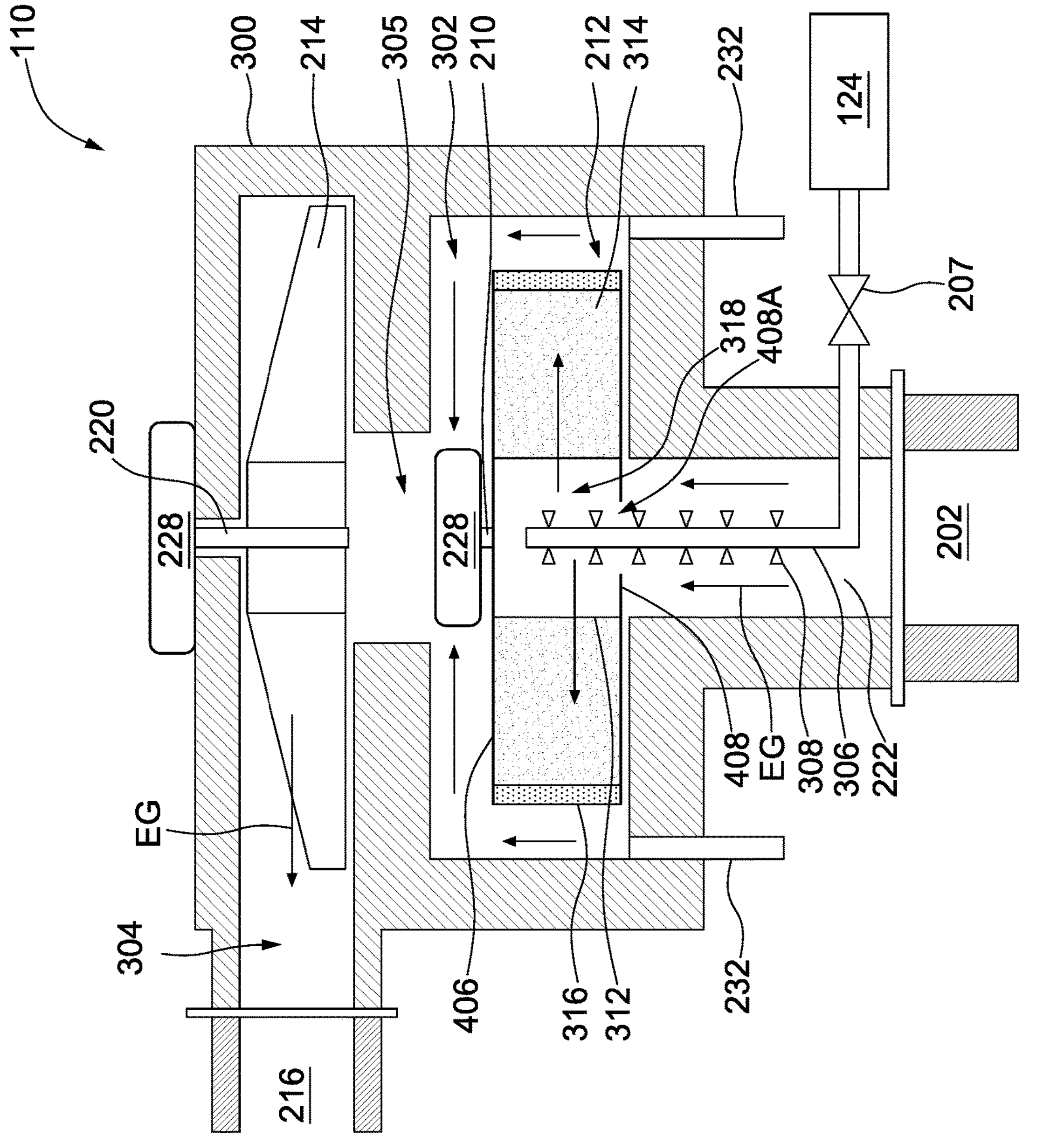
FIG. 3 is a block diagram of the particle separator shown in FIG. 2, in accordance with some embodiments of the present disclosure.

FIG. 3 is a block diagram of the particle separator 110 shown in FIG. 2, in accordance with some embodiments of the present disclosure. In some embodiments, as illustrated in FIG. 3, the particle separator 110 includes chamber walls 300 and the particle separator 110 is compartmented by the chamber walls 300 into a first chamber 302, a second chamber 304 and a chamber channel 305. The exhaust gas EG is pumped into the particle separator 110 from the exhaust gas inlet 202, through the first chamber 302, the chamber channel 305 and the second chamber 304, and reaches the hopper 216, as indicated by the arrows. In some embodiments, the first fan 212 is arranged in the first chamber 302 and the second fan 214 is arranged in the second chamber 304. In some embodiments, the second fan 214 is arranged downstream of the first fan 212.

The particle separator 110 may further include a mist dispenser 306 connected to the mist generator 206 and extending in the exhaust gas inlet 202. The mist dispenser 306 is configured to transport and spray the fluid mist generated by the mist generator 206. The mist dispenser 306 also includes a dispensing line extending from the mist generator 206 to the inside of the first fan 212. The mist dispenser 306 also includes a plurality of nozzles or sprinklers 308 on the dispensing line for dispensing the fluid mist into the input channel 222 and the first fan 212 where the exhaust gas EG is distributed. The nozzles 308 may be arranged in a row from the input channel 222 to the inside of the first fan 212, e.g., a central location of the first fan 212. The nozzles 308 may also be arranged to dispense the fluid mist outwardly in a radial manner from the dispensing line.

In some embodiments, the beam of fluid mist generated by the mist generator 206 includes atomized fluid droplets having a relatively small droplet size to increase the total surface area of the droplets of the fluid mist. The higher the contact area between the fluid mist and the exhaust gas EG is, the better result the agglomeration process of the particles in the exhaust gas EG may achieve. In some embodiments, the mist generator 206 is configured to generate the fluid mist of the desired droplet size by mixing the fluid with high pressure air to form the fluid mist before sprinkling the fluid mist. Alternatively, the fluid mist is generated by utilizing high-pressure spraying to sprinkle the fluid mist out of the nozzle 308 while breaking the fluid into the mist droplets of a desirable droplet size.

In some embodiments, the mist generator 206 is configured to use water, e.g., deionized water, for generating the fluid mist. In some embodiments, the fluid mist includes other kinds of solutions, e.g., acid or alkaline solutions, to adjust, e.g., neutralize, the pH level of the exhaust gas EG.

In some embodiments, the particle separator 110 further includes a motor 228 and shafts 210 and 220, in which the motor 228 is configured to rotate the first fan 212 through the shaft 210, while the motor 208 is configured to rotate the second fan 214 through the shaft 220, In some embodiments, the first fan 212 and the second, fan 214 are rotated by a same motor, e.g., the motor 208. In some embodiments, the shafts 210 and 220 rotate about the same or different axes.

Figure 4A:
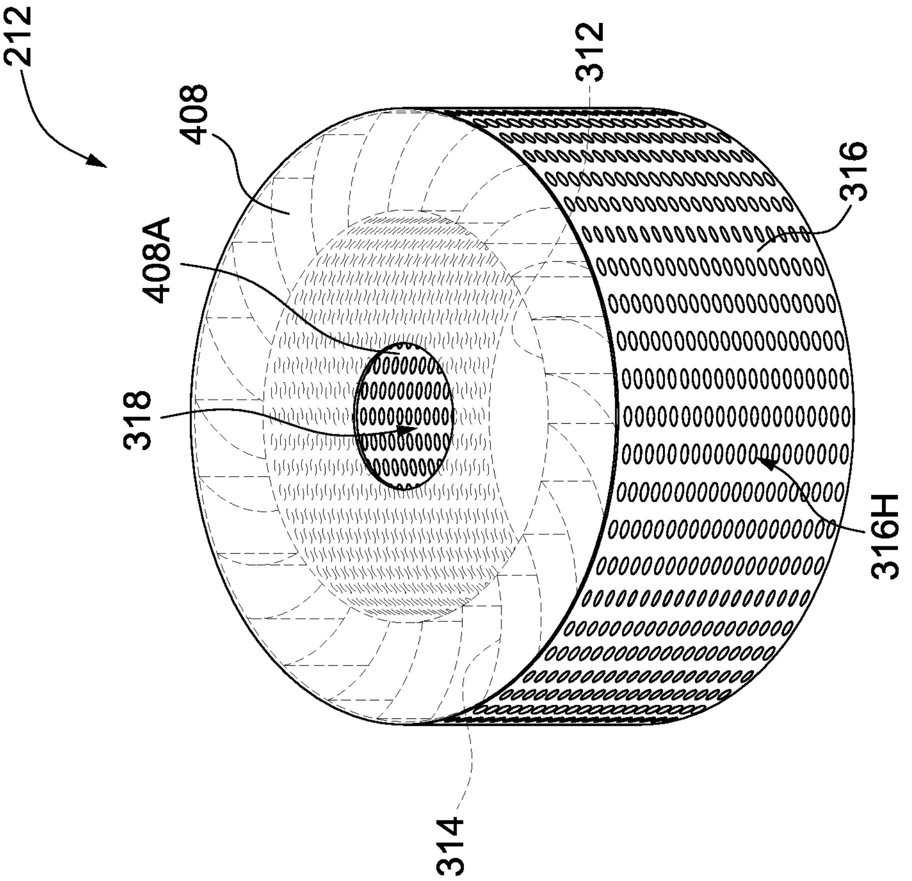
FIGS. 4A and 4B show perspective views of a first fan of the particle separator shown in FIG. 2 or FIG. 3, in accordance with various embodiments of the present disclosure.
Figure 4B:
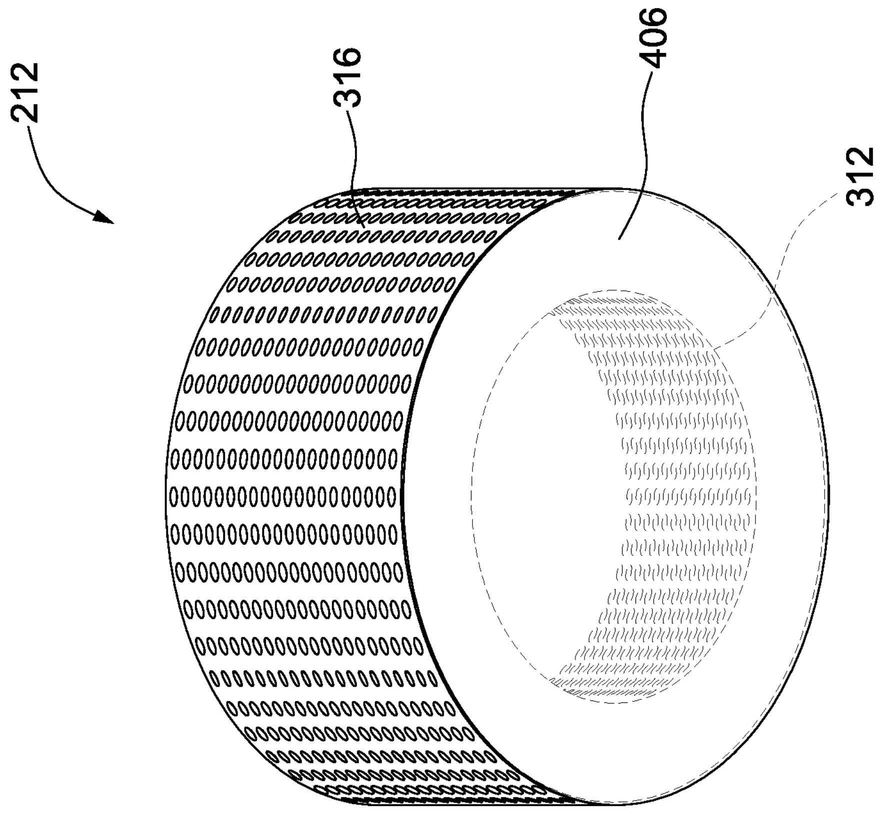

As illustrated in FIG. 3, the first fan 212 includes an inner mesh member 312, a plurality of blades 314, an outer mesh member 316, an upper cover 406 and a lower cover 408. FIGS. 4A and 4B show perspective views of the first fan 212 in FIG. 2 or FIG. 3, in accordance with various embodiments of the present disclosure. The first fan 212 can be referred to herein as a particle separator fan, while the second fan 214 can be referred to herein as a draft fan, in which the first fan 212 serves to capture the particles in the exhaust gas EG and filter these particles through mixing with the fluid mist, while the second fan 214 serves to generate an airflow to draw the exhaust gas EG from the exhaust gas inlet 202 into the first fan 212 during a particle filtration operation and pump the cleaned exhaust gas EG out of exhaust gas outlet 204.

The upper cover 406 and the lower cover 408 are arranged on an upper side and a lower side, respectively, of the first fan 212. The upper cover 406 and the lower cover 408 are attached to the inner mesh member 312, the blades 314 and the outer mesh member 316 to form an enclosed space of the first fan 212 from the upper side and the lower side of the first fan 212. In some embodiments, the parts of the first fan 212, e.g., the inner mesh member 312, the blades 314, the outer mesh member 316, the upper cover 406 and the lower cover 408 are formed of rigid materials, e.g., plastic, polymer, metal, stainless steel, or the like. These parts may be multilayer structures or include a coating formed thereon.

In some embodiments, the first fan 212 has a cylinder shape. The inner mesh member 312 is in a ring shape or a polygonal shape when viewed from above. The inner mesh member 312, the upper cover 406 and the lower cover 408 define a central chamber 318 at a central location of the first fan 212. Similarly, the outer mesh member 316 is in a ring shape or a polygonal shape when viewed from above and defines the periphery of the first fan 212. Each of the blades 314 includes one end coupled to the sidewall of the inner mesh member 312 and the other end coupled to the sidewall of the outer mesh member 316. The lower cover 408 may include an opening 408A facing the input channel 222 and connecting the input channel 222 to the central chamber 318, wherein the mist dispenser 306 extends into the central chamber 318 through the opening 408A. In this connection, the exhaust gas EG can flow into the first chamber 302 or the first fan 212 only through the opening 408A.

Figure 5:
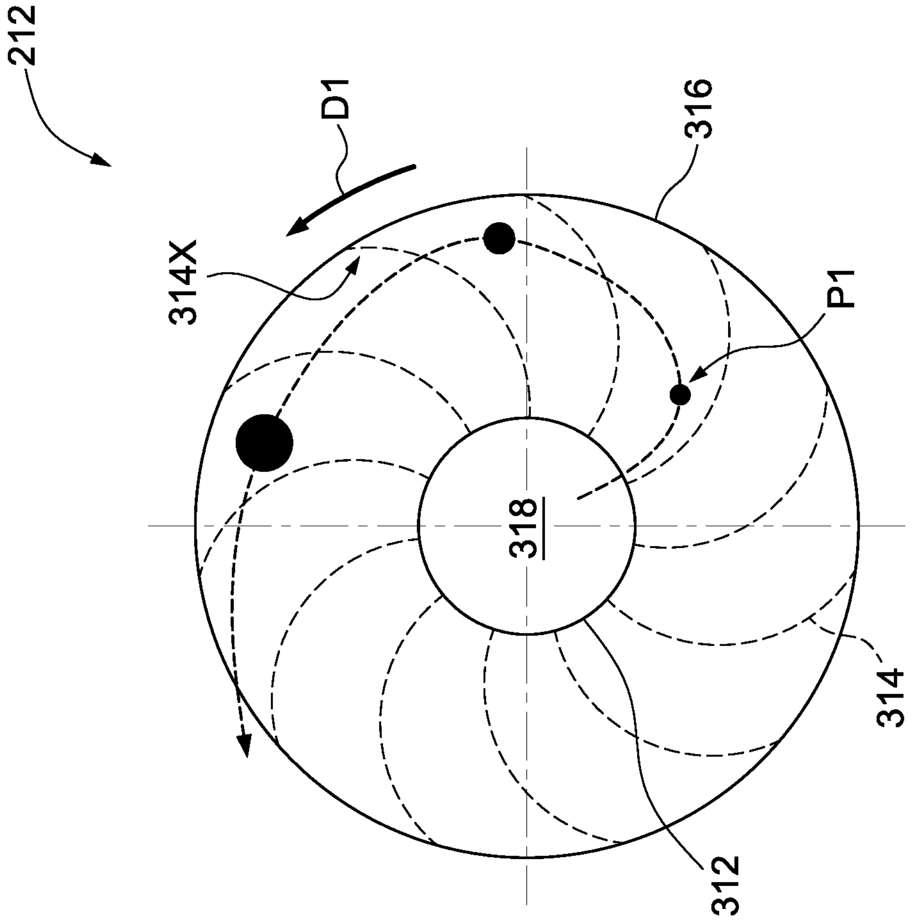
FIG. 5 shows a top view of the first fan shown in FIG. 4A and FIG. 4B, in accordance with various embodiments of the present disclosure.

FIG. 5 shows a top view of the first fan 212 shown in FIG. 4A and FIG. 4B, in accordance with various embodiments of the present disclosure. Some parts of the first fan 212, e.g., the upper cover 406, are omitted from FIG. 5 in order not to obscure the underlying features of the particle separator 110, Referring to FIGS. 3, 4A, 4B and 5, at the beginning stage of operation, the first fan 212 and the second fan 214 are rotated through the motors 228 and 208, respectively. In the meantime, the fluid mist is dispensed to the central chamber 318 of the second fan 212. The fluid mist is diffused by the air pressure exerted by the first fan 212 and the second fan 214 from the central chamber 318 to the space of the blades 314 between the inner mesh member 312 and the outer mesh member 316. The blades 314 laterally surround the central chamber 318 and configured to rotate about the central chamber 318.

Figure 6B:
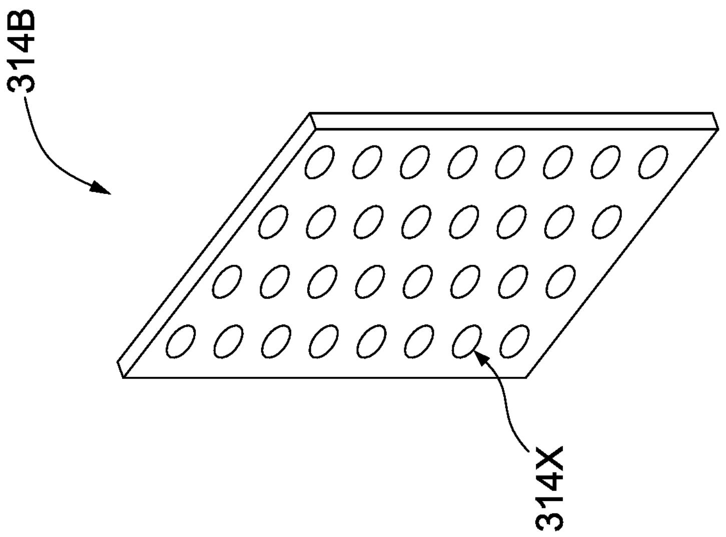
FIGS. 6A, 6B, 6C and 6D show perspective views of a blade of the first fan shown in FIG. 4A and FIG. 4B, in accordance with various embodiments of the present disclosure.
Figure 6A:
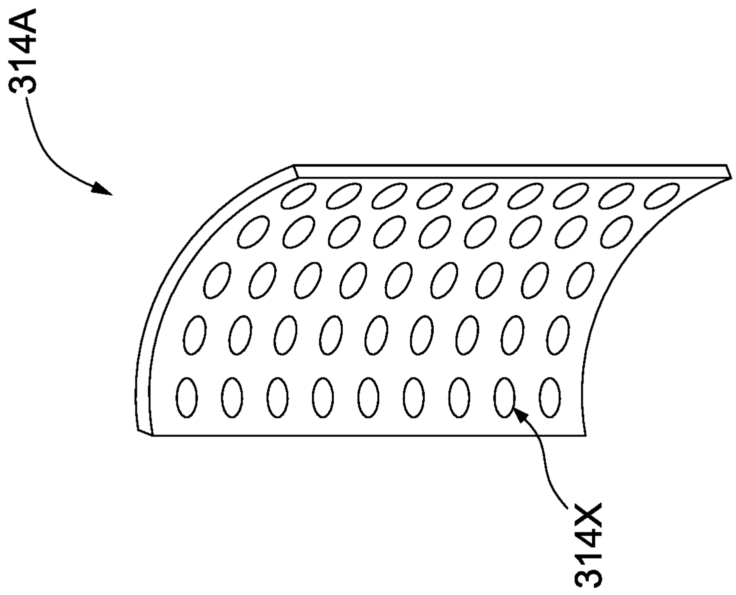

FIG. 6A shows a perspective view of an exemplary blade 314A of the first fan 212 shown in FIG. 4A and FIG. 4B, in accordance with various embodiments of the present disclosure. The blade 314A has a curve shape when viewed from above. The blade 314A has a substantially equal thickness throughout the wall of the entire blade 314A. The blade 314A includes holes 314X arranged in an array on the wall of the blade 314A. In the present embodiment, the holes 314X are arranged in an array of five columns and 9 rows; however, the configurations of the holes 314X may be different, as illustrated in other figures discussed later.

Referring to FIGS. 4A and 4B, each of the inner mesh member 312 and the outer mesh member 316 include a mesh pattern that forms a plurality of holes (an example hole 316H is labelled in FIG. 4A) to permit the exhaust gas EG along with the fluid mist to flow through when the exhaust gas EG is pumped into the space between the blades 314 from the central chamber 318 or to flow out of the outer mesh member 316. These holes 316H may be arranged in rows, in columns, or in an array on the walls of the inner mesh member 312 and the outer mesh member 316. Alternatively, the inner mesh member 312 or the outer mesh member 316 includes the holes 316H randomly distributed on the wall thereof.

The mesh pattern or the configuration of the holes 316H of the inner mesh member 312 and the outer mesh member 316 is determined to cause liquid membranes to be formed on the holes 316H to serve as a particle catcher for increasing the probability of particle filtration. In some embodiments, the holes 31611 have a circular shape, a polygonal shape, a crescentic shape, or any suitable shape. The size of the holes 316H may be determined based on factors such as the flow rate of the exhaust gas EG, the droplet size of the fluid mist, and the like. In the present embodiment, the holes 316H have a size in a range between about 0.5 mm and about 3 mm. In some embodiments, the holes 316H have a size in a range between about 1 mm and about 2 mm. If the hole size is made less than about 0.5 mm, the resistance to air flow, which results from the wall of the inner mesh member 312 or the outer mesh member 316, may be too high and hinder the flow of the exhaust gas EG. If the hole size is made greater than about 3 mm, the liquid membrane may not be formed easily. The configurations of the mesh pattern or the holes 31611, e.g., the number, the density, the shape, and the array pattern, may be varying depending upon different particle filtration requirements and are within the contemplated scope of the present disclosure.

In some embodiments, the inner mesh member 312 is omitted, and the blades 314 are secured to the upper cover 406, the lower cover 408 and the outer mesh member 316. In such scenarios, the fluid mist is directly drawn into the space between the blades 314 with a greater flow rate, thereby causing the fluid mist to be uniformly distributed across the first fan 212 more quickly.

The exhaust gas EG and the particles are carried through the first fan 212 in two types of movements. In the first type movement, the airflow generated by of the second fan 214 draws the exhaust gas EG and the particles out of the outer mesh member 316. The exhaust gas EG moves in a radial or straight-line trajectory in the first type movement. In the second type movement, the blades 314 rotate the exhaust gas EG and the particles in the space between the blades 314. As illustrated in FIG. 5, the second fan 212 is rotated in a counterclockwise direction D1, and thus an example particle P1 in the exhaust gas EG is rotated by the blades 314 in the counterclockwise direction D1. As a result, the combination of the first and second movements causes the exhaust gas EG and the particle P1 to move in a spiral-like trajectory when viewed from above until they flows out of the first fan 212.

In the meantime, the fluid mist is dispensed to fill the space between the blades 314 by the pumping force of the second fan 214 and the rotation force of the blades 314, in a similar trajectory of the exhaust gas EG and the particle P1. The agglomeration process occurs when the fluid mist is mixed with the particle P1. In some embodiments, homogeneous nucleation of the particle P1 with the droplets of the fluid mist facilitates the agglomeration process, which causes the effective size of the fluid-mixed particle P1 in the exhaust gas EG to grow, e.g., from less than about 0.1 μm to greater than about 5 μm, along the movement trajectory. Referring to FIG. 3, the droplets of the fluid mist along with the enlarged particle P1 flowing out of the outer mesh member 316 may condense and be drained out of the first fan 212 through the drainpipes 232. The particle P1 is thus separated from the exhaust gas EG due to its greater particle size and increased particle mass, and the cleaned exhaust gas EG can be obtained it flows out of the first fan 212.

The performance of particle separation is determined by the likelihood of mixing of the particles with the droplets through the agglomeration process. Thus, the particle separator 110 provides advantageous aspects to increase the likelihood of the agglomeration process, such as increasing the total area of the droplets of the fluid mist, increasing the length of the movement trajectory of the particles in the particle separator 110, increasing the distribution uniformity of the fluid mist in the particle separator 110, or the like.

It can be observed that the spiral trajectory of the movement for the particle P1 has a greater length than the radial trajectory caused by a conventional particle separator which does not employ the rotary blades 314. Since the movement trajectory of the particle P1 is lengthened, the duration of stay of the particle P1 in the first fan 212 is increased and the probability of agglomeration of the particle P1 is increased accordingly. As a result, the filtration performance of the particle separator 110 is improved.

The droplet size of the fluid mist is one of the factors that influence the performance of the agglomeration process. The fluid mist with smaller droplets may lead to greater surface areas of the droplets, and hence increases the probability of contact with the particles. In some embodiments, the droplet size of the fluid mist is less than about 200 μm, less than about 100 μm or less than about 50 μm. In some embodiments, droplet size of the fluid mist is in a range between about 20 μm and about 100 μm, between about 20 μm and about 50 μm or between about 50 μm and about 100 μm. If the droplet size is made greater than about 200 μm, the droplets may not have sufficient contact areas to effectively capture the particles. If the droplet size is made less than about 20 μm, the resultant agglomerated particles may not be large enough to be separated from the exhaust gas EG and drained efficiently.

In some embodiments, the performance of the agglomeration process is also close related to the flow rate of the fluid mist as well as the flow rate of the exhaust gas EG. In some embodiments, the mass flow ratio between the fluid mist and the exhaust gas is in a range between about 2 and about 5. As a result, the rotation speed of the first fan 212 or the second fan 214 is determined according to the chosen flow rate of the exhaust gas EG. In some embodiments, the first fan 212 or the second fan 214 is rotated at a rotation speed between about 600 rpm and 6000 rpm, or between about 900 rpm and about 4000 rpm. In some embodiments, the first fan 212 or the second fan 214 provides a flow rate between about 500 cubic meters per hour (cmh) and 3500 cmh, or between about 1500 cmh and about 2500 cmh. In some embodiments, the dispensing rate of the mist generator 206 is between about 5 liters per minute (lpm) and about 10 lpm.

In some embodiments, the configuration of the holes 314X may affect the agglomeration process. The holes 314X may have a size in a range between about 0.5 mm and about 3 mm, or between about 1 mm and about 2 mm. If the holes 314X are made greater than about 3 mm, the blades 314 may not effectively carry the exhaust gas EG to rotate in the first fan 212. As a result, the movement trajectory of the particles may not achieve the maximal length. If the holes 314X are made less than about 0.5 mm, it is not easy for the droplets of the fluid mist to flow in different compartments between the blades through the holes 314X. As a result, most of the droplets are confined in one or two compartments between the adjacent blades 314. The fluid mist of small droplets staying in the limited space of the compartment may tend to combine into large droplets, and the total contact area of the fluid mist may decrease accordingly. The blades 314 with the holes 314X not only serves the function of rotate the exhaust gas EG to increase the movement trajectory, but also agitates the fluid mist to such that the tiny mist droplets can be distributed in the first fan 212. As such, the holes 314X with a sufficient hole size, e.g., greater than about 0.5 mm, may facilitate distribution of the fluid mist across different compartments across the entire first fan 212, and decrease the chances of recombination of the droplets in the first fan 212 before the agglomeration process.

Figure 6D:
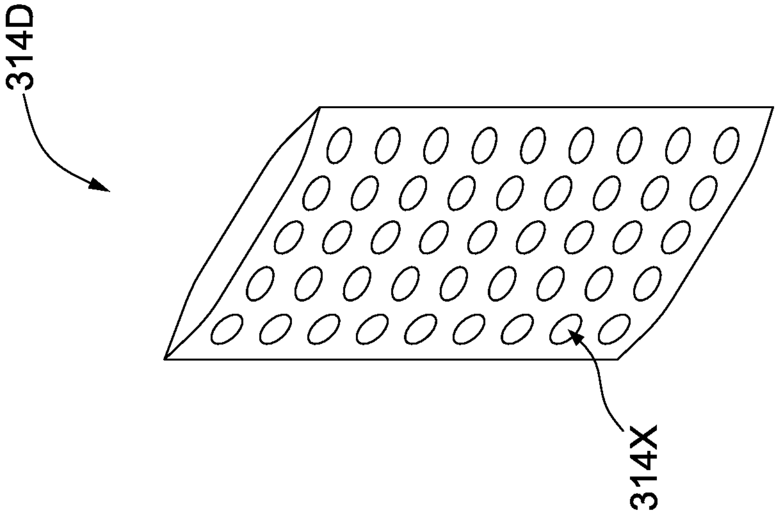
Figure 6C:
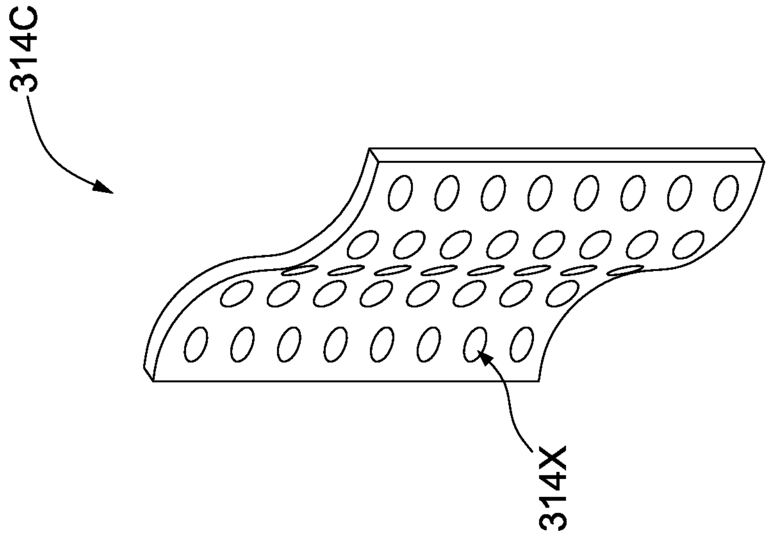

FIGS. 6B, 6C and 6D show perspective views of exemplary blade 314B, 314C and 314D, respectively, of the first fan 212 shown in FIG. 4A and FIG. 4B, in accordance with various embodiments of the present disclosure. The blades 314B through 314D are similar to the blade 314A in many aspects, and these similar features are not repeated for brevity. Referring to FIG. 6B, the blade 314B has the wall with a planar or flat surface from a cross-sectional view. Referring to FIG. 6C, the blade 3140 has the wall with a doubly curved surface or a wavy surface from a cross-sectional view. Referring to FIG. 6D, the blade 314D has the wall with an airfoil shape from a cross-section view. The different shapes of the walls of the blades 314A through 314D may generate different types of fluid distributions for the exhaust gas EG as well as the fluid mist. The selection of suitable types of the blades 314 may be based on different applications of particle filtration. Although not explicit illustrated, other shapes of the walls of the blades 314 are also within the contemplated scope of the present disclosure.

Figure 7B:
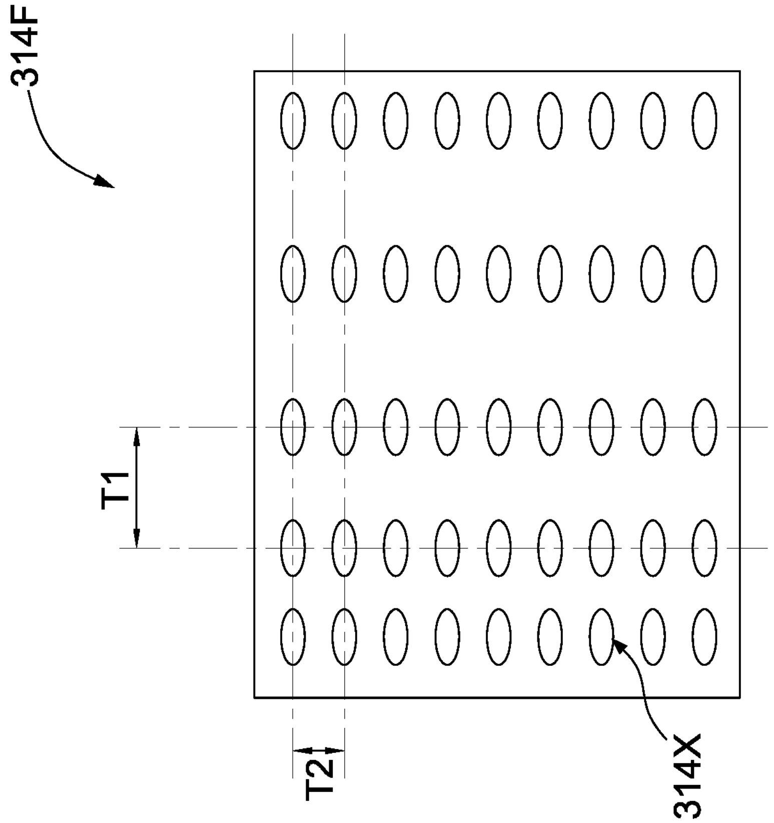
FIGS. 7A, 7B, 7C and 7D show elevation views of a blade of the first fan shown in FIG. 4A and FIG. 4B, in accordance with various embodiments of the present disclosure.
Figure 7A:
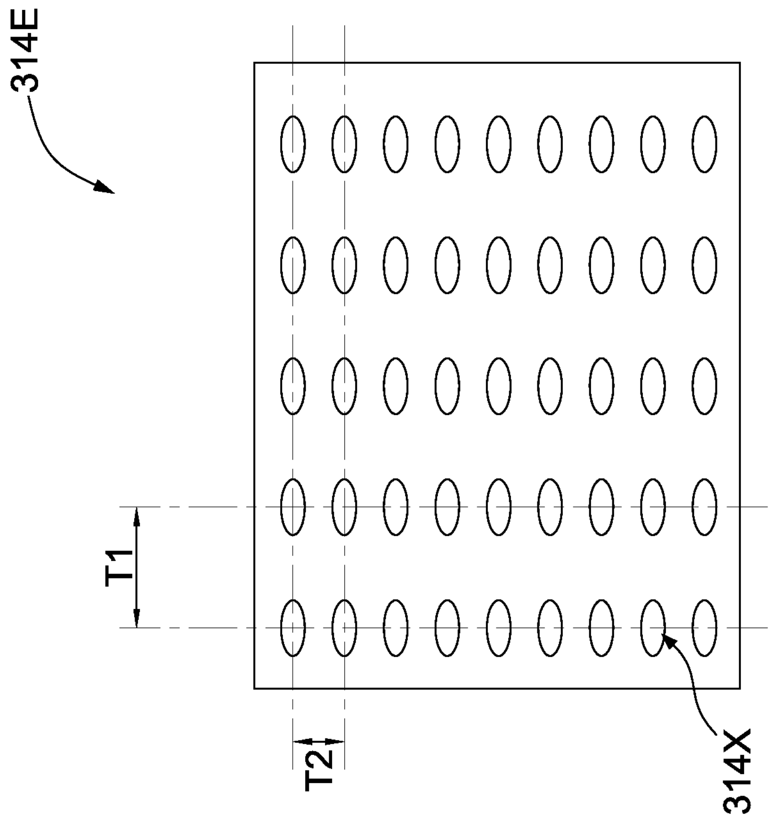

FIGS. 7A, 7B, 7C and 7D show elevation views of blade 314E, 314F, 314G and 314H, respectively, of the first fan 212 shown in FIG. 4A and FIG. 4B, in accordance with various embodiments of the present disclosure. The blades 314E through 314H shown in respective FIGS. 7A through 7D can be drawn from any of FIGS. 6A through CD. Referring to FIG. 7A, the holes 314X of the blade 314E are arranged with substantially equal column pitches T1 and substantially equal row pitches T2, In some other embodiments, the column pitch T1 and the row pitch T2 may vary across different columns or rows. For example, referring to FIG. 7B, the holes 314X of the blade 314F are arranged with different column pitches T1 and substantially equal row pitches T2. The different column pitches T1 for different columns may help redistribute the fluid mist more quickly and uniformly across the first fan 212, e.g., from the end adjacent to the central chamber 318 to the end adjacent to the outer mesh member 316.

Figure 7D:
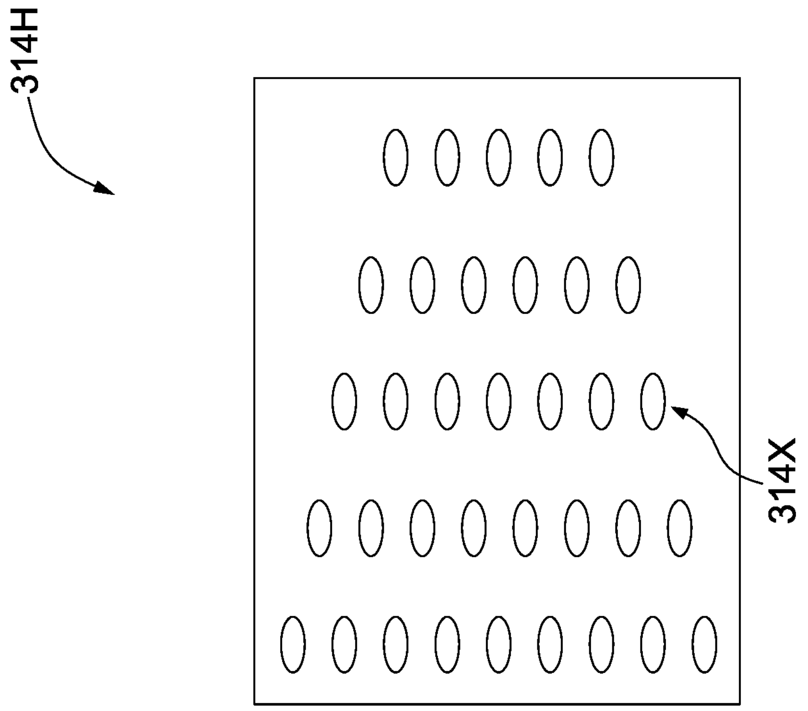
Figure 7C:
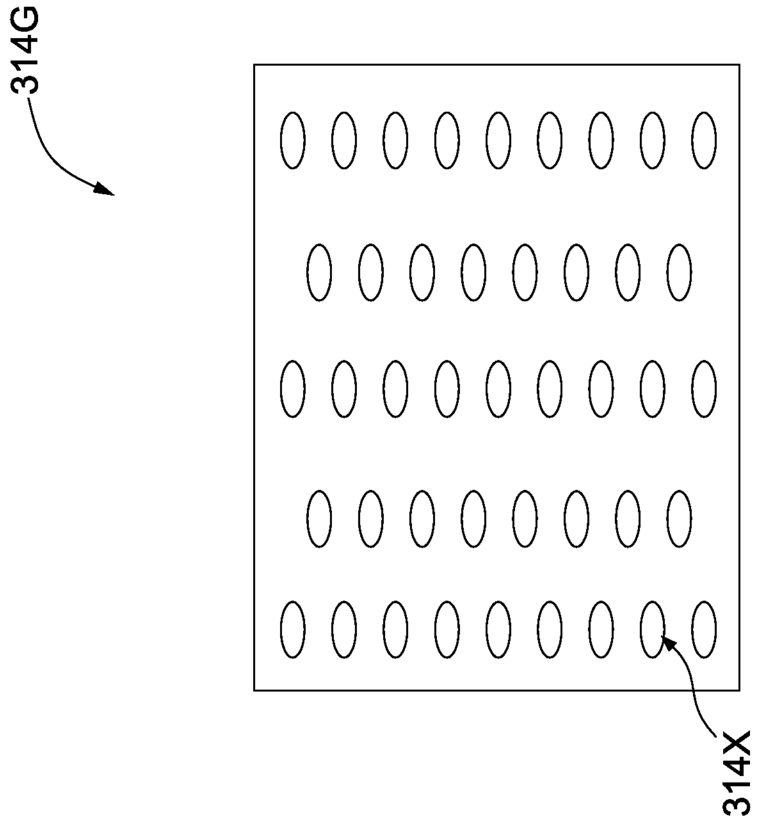

Referring to FIG. 7C, although the column pitch T1 and the row pitch T2 of the holes 314X of the blade 314F are substantially the same across different columns and rows, the holes 314X may be arranged in a staggering manner across different columns. Referring to FIG. 7D, the layout of the holes 314X of the blade 314H is further altered such that the numbers of the holes 314X may be different across different columns or rows. In the present embodiments, the number of holes 314X are monotonically decreasing from the end adjacent to the central chamber 318 to the end adjacent to the outer mesh member 316. However, other configurations of the numbers of the holes 314X are also within the contemplated scope of the present disclosure.

Figure 8B:
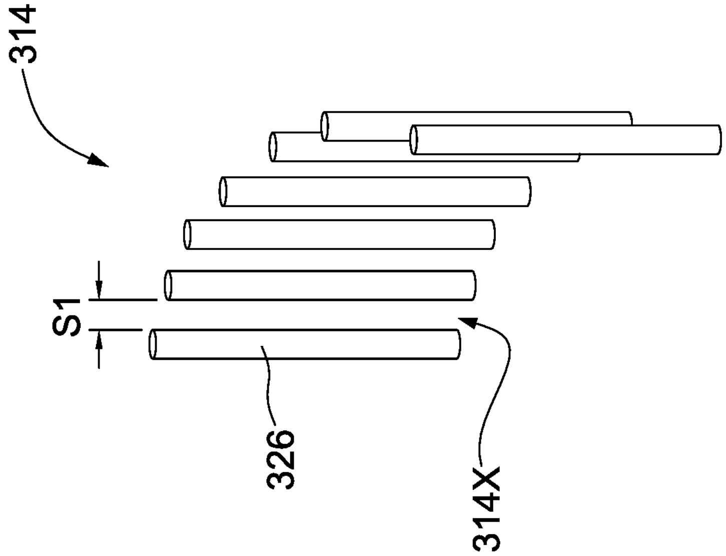
FIG. 8B shows a perspective view of a blade of the first fan shown in FIG. 8A, in accordance with various embodiments of the present disclosure.
Figure 8A:
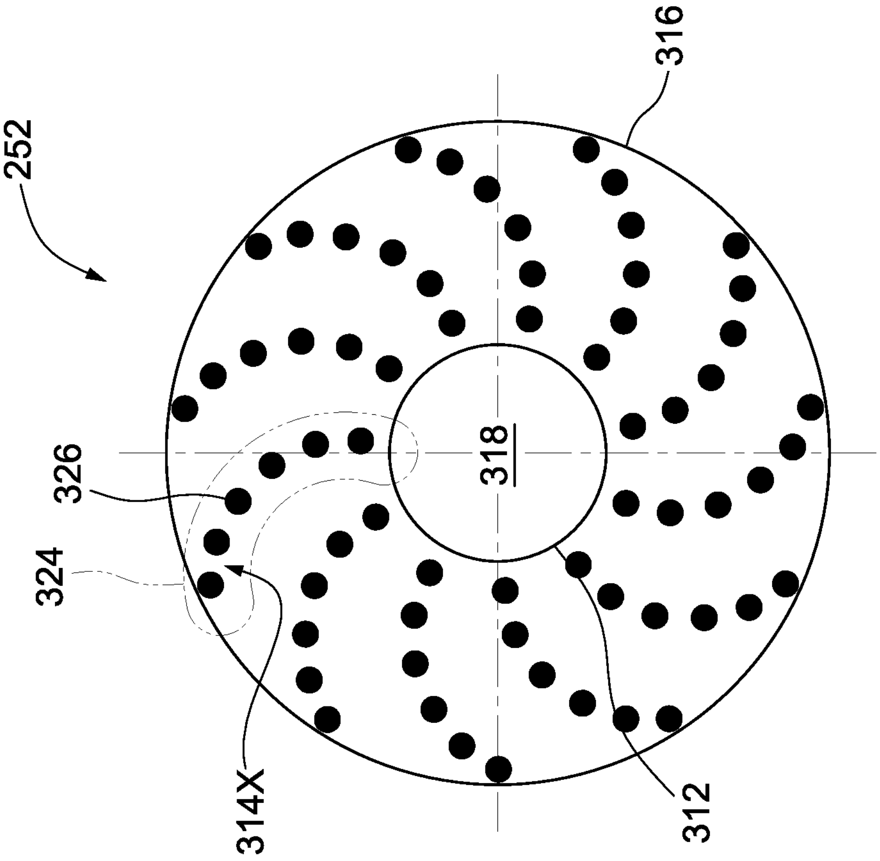
FIG. 8A shows a top view of the first fan shown in FIG. 4A and FIG. 4B, in accordance with various embodiments of the present disclosure.

FIG. 8A shows a top view of a first fan 252 shown in FIG. 4A and FIG. 4B, in accordance with various embodiments of the present disclosure. The first fan 252 is similar to the first fan 212 shown in FIG. 3 in many aspects, such as the inner mesh member 312, the outer mesh member 316 and the central chamber 318 discussed previously, and the descriptions of these features are omitted for brevity. The first fan 252 also includes blades 324 arranged in the space between the inner mesh member 312 and the outer mesh member 316 in a manner similar to the blades 314. The blade 324 differs from the blade 314 in that the blade 324 is formed of individual scramblers 326 extending between the upper cover 406 and the lower cover 408, in which the scramblers 326 are separate from each other and are arranged in parallel.

FIG. 8B shows a perspective view of an example blade 324 of the first fan 252 shown in FIG. 8A, in accordance with various embodiments of the present disclosure. As illustrated in FIGS. 8A and 8B, the scramblers 326 of each of the blades 314 are arranged in a curved line when viewed from above. In some embodiments, each of the scramblers 326 includes a cylinder, a cuboid, a polygonal prism, or the like. In some embodiments, the scrambler 326 includes a circular shape, a polygonal shape or a ring shape from a top-view perspective. The blade 324 has a scrambler spacing S1 between the adjacent scramblers 326. In some embodiments, the scrambler spacing is substantially uniform from the bottom of the blade 324 to the top of the blade 324. In some embodiments, the scrambler spacing S1 is between about 0.5 mm and about 3 mm. In some embodiments, the scrambler spacing S1 between the scramblers 326 is seen as an elongated hole 314X of the blade 324, in which the hole 314X extends from the bottom of the blade 324 to the top of the blade 324. The design of the scrambler 326 with the scrambler spacing S1 of the blade 324 may increase the hole area of the blade while decreasing the manufacturing cost of the blade 324. The width of the hole 314X may be kept as a predetermined size of the hole 314X shown in FIGS. 6A through 6D and 7A through 7D. In some embodiments, the liquid membrane formed from the liquid mist on the hole 314X has a greater area as compared to that formed on the hole 314X of the blade 314. The particle filtration performance may be enhanced accordingly.

The different types of the blades 314 with different arrangements of the walls and holes 314X as shown in FIGS. 6A through 6D, FIGS. 7A through 7D and FIGS. 8A and 8B may generate different types of fluid distributions for the exhaust gas EG as well as the fluid mist during the agglomeration process. The selection of suitable types of the blades 314 may be based on different applications of particle filtration. Although not explicit illustrated, other types of the blades 314 are also within the contemplated scope of the present disclosure.

Referring to FIG. 3, as discussed previously, the second fan 214 is configured as a draft fan to exert a pumping force on the exhaust gas EG. The second fan 214 can be any suitable type of draft fan, such as a centrifugal fan, an axial fan, a mixed-flow fan, or the like. In some embodiments, the centrifugal fan may be categorized as a forward curved blade type, a backward curved blade type and a radial blade type. The operation parameters of the second fan 214, such as the rotation speed, air pressure, air flow rate, supply current levels, are determined according to different requirements of the semiconductor fabrication system 100 and the conditions of the semiconductor tools 102.

Figure 9:
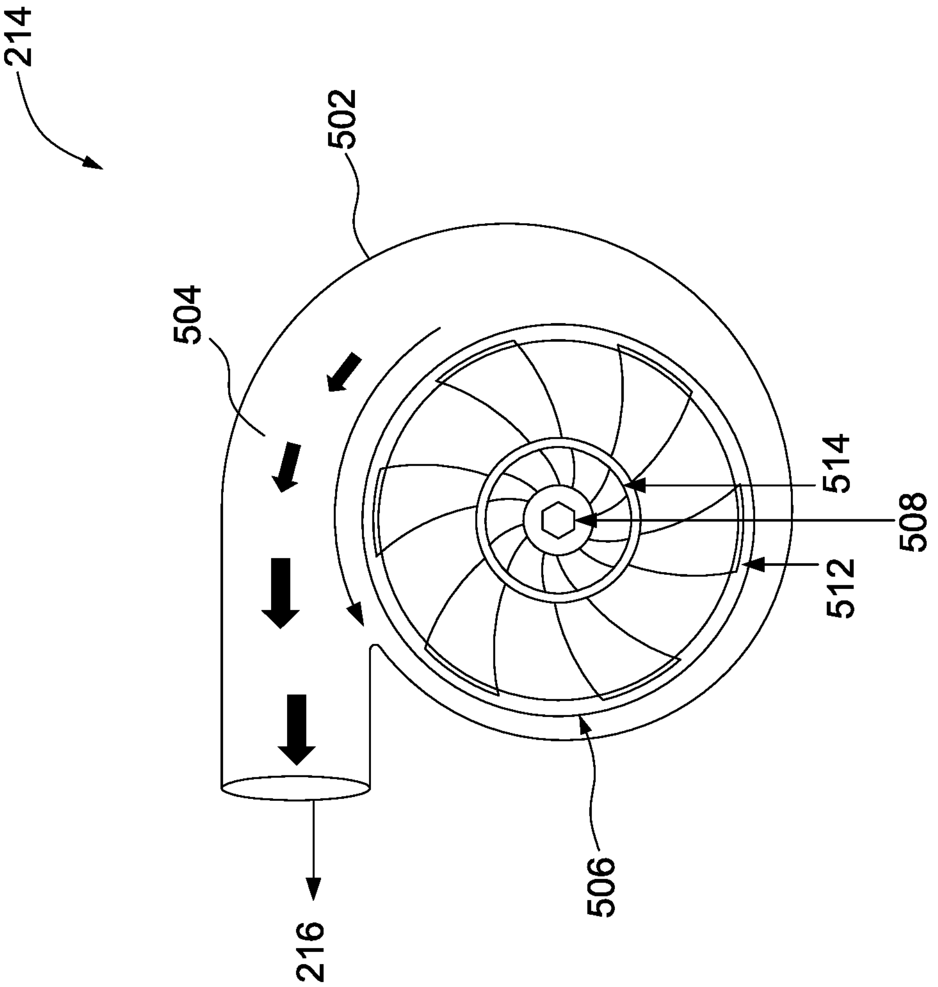
FIG. 9 shows a plan view of a second fan of the particle separator shown in FIG. 2 or FIG. 3, in accordance with some embodiments.

FIG. 9 shows a plan view of an example second fan 214 of the particle separator 110 shown in FIG. 2 or FIG. 3, in accordance with some embodiments. The second fan 214 illustrated in FIG. 9 is a centrifugal fan and includes a volute casing 502, an impeller 506 and a shaft 508. Referring to FIG. 2 and FIG. 9, the volute casing 502 defines a volute chamber 504 that encloses the impeller 506, where the shaft 508 extends from the motor 208, through the volute casing 502 and connects to the impeller 506. The impeller 506 is rotated by the motor 208 through the rotation of the shaft 508. The other portions of the volute chamber 504 serves as an air channel for the flow of the exhaust gas EG, and the exhaust gas EG flows along the path the spiral shape of the volute casing 502 to reach the hopper 216.

An opening 514 is formed on the volute casing 502 and corresponding to the center of the impeller 506 around the shaft 508. The opening 514 is arranged facing the chamber channel 305 and the first fan 212, where the cleaned exhaust gas EG exhausted from the first fan 212 is directed into the second fan 214 from the opening 514. The opening 514 may be in an annular shape or other suitable shape and laterally, surround the shaft 508.

In some embodiments, the impeller 506 includes a plurality of vanes or blades 512 connected to the shaft 508 and radially extended from the shaft 508. In some embodiments, the impeller 506 may be of different configurations, such as an open-type impeller, a semi open-type impeller, and an enclosed-type impeller. In the embodiment of the impeller 506 of a semi-open type or an enclosed type, a shroud or disk (not separately shown) is provided on one side or two sides of the blades 512 in a plan substantially perpendicular to the shaft, in which the adjacent blades 512 are fully or partially adjoined by the shroud. The impeller type of the impeller 506 is selected according to the requirements of the particle separator 110.

In some embodiments, the performance of particle filtration is closely related to factors such as the radial flow speed of the exhaust gas EG in the first fan 212, the rotation speed of the first fan 212, the (molecular or atomic) weight of the particles to be filtered, the mass concentration of the particles to be filtered, and the like. In some embodiments, the rotation speed of the first fan 212 or the second fan 214 is inversely proportional to the weight of the particles to be filtered in order to provide substantial equal centrifugal forces for different types of particles.

In some embodiments, the rotation speed of the second fan 214 is in a range between about 1,800 rpm and about 4,200 rpm. In some embodiments, the flow rate of the second fan 214 is in a range between about 1,000 rpm about 6,000 lpm.

Figure 10:
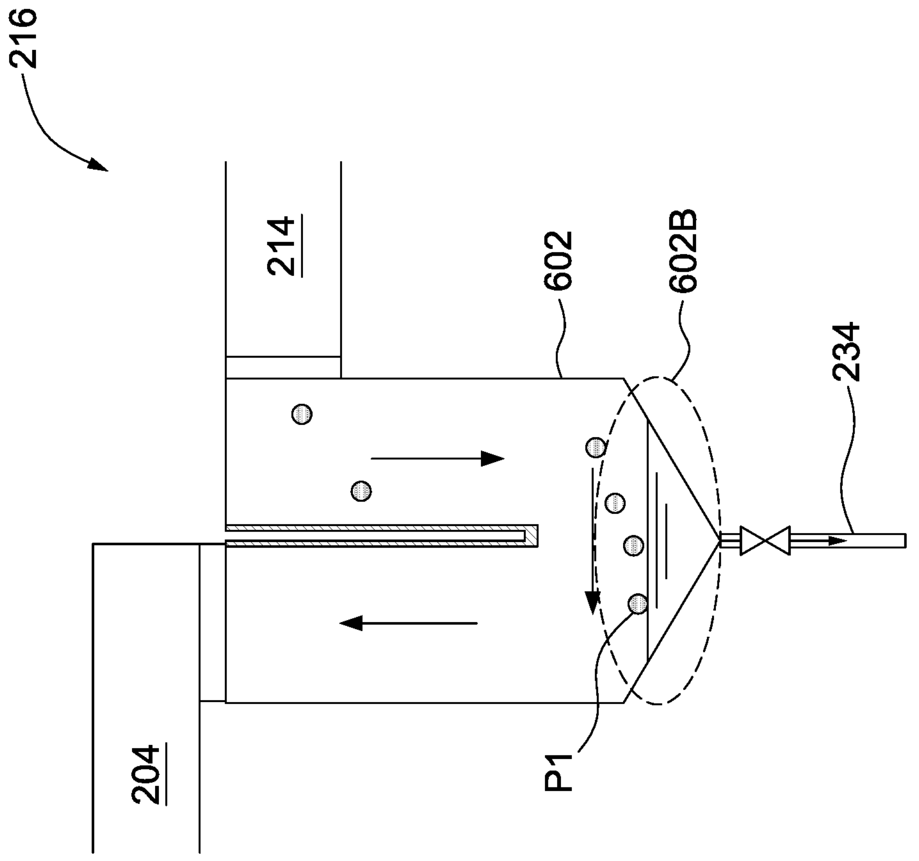
FIG. 10 shows a block diagram of a hopper of the particle separator shown in FIG. 2 or FIG. 3, in accordance with some embodiments.

FIG. 10 shows a block diagram of the hopper 216 of the particle separator 110 shown in FIG. 2 or FIG. 3, in accordance with some embodiments. The hopper 216 includes a hopper wall 602 having a U-shape channel configured to direct the exhaust gas EG discharged by the second fan 214 toward the exhaust gas outlet 204. In some embodiments, the channel of the hopper 216 includes a bottom portion 602B at the bottom of the hopper 216, The bottom portion 602B may contain liquid, e.g., water or other suitable solution, configured to absorb the residual fluid mist and the particles left in the exhaust gas EG passing through the hopper 216. During operation, the exhaust gas EG along with the residual fluid mist is exhausted out of the particle separator 110 by the second fan 214. The centrifugal force exerted on the fluid mist may further drive the fluid mist to move outwardly when the exhaust gas EG flows through the bottom portion 602B. As a result, the fluid mist along with the particles may fall into the liquid at a corner of the bottom portion 602B, and the performance of particle filtration and dehydration of the particle separator 110 can be improved by the hopper 216.

FIG. 11 shows a flowchart of a particle filtration method 700, in accordance with some embodiments. It shall be understood that additional steps can be provided before, during, and after the steps shown in FIG. 11, and some of the steps described below can be replaced or eliminated, for additional embodiments of the method 700. The order of the steps may be interchangeable. Some of the steps may be performed concurrently or independently.

At step 702 a workpiece is processed in a semiconductor apparatus. The processing of the workpiece causes generation of an exhaust gas. At step 704, the exhaust gas is exhausted from the semiconductor apparatus to a particle separator. In some embodiments, the particle separator includes a first fan having a central chamber and a plurality of blades.

At step 706, a mist is dispensed into the central chamber to mix with the exhaust gas. At step 708, the first fan is rotated while the mist is dispensed to permit mixing of the exhaust gas with the mist between the central chamber and a periphery of the particle separator.

Figure 12:
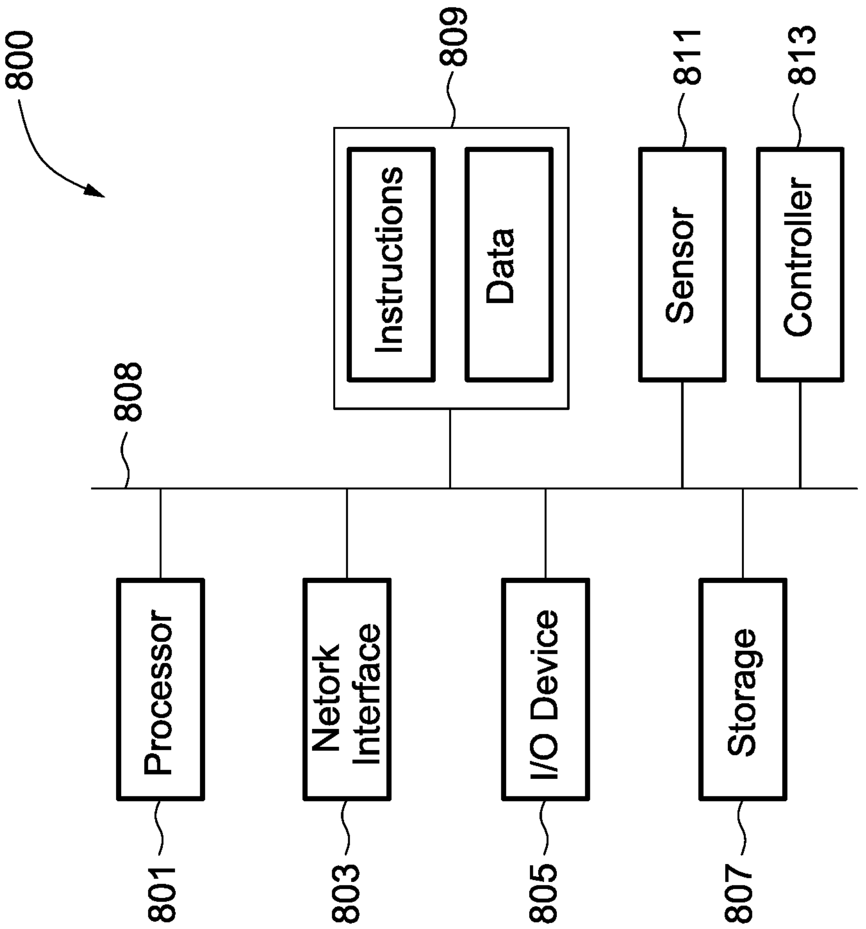
FIG. 12 is a block diagram of a computing system implementing a particle filtration method, in accordance with some embodiments.

FIG. 12 is a block diagram of a computing system 800 implementing a particle filtration method, in accordance with some embodiments. The system 800 may be operated together with a semiconductor fabrication system (e.g., the semiconductor fabrication system 100) or a particle separator (e.g., the exhaust gas cleaning apparatus 106) alone. The system 800 includes a processor 801, a network interface 803, an input and output (I/O) device 805, a storage 807, a memory 809, a bus 808, a sensor 811 and a controller 813. The bus 808 couples the network interface 803, the I/O device 805, the storage 807, the memory 809, the sensor 811, the controller 813 and the processor 801 to each other.

The processor 801 may correspond to or be included in the processor 120. The processor 801 is configured to execute program instructions configured to perform the steps of particle filtration or exhaust gas cleaning as described and illustrated with reference to figures of the present disclosure. In some embodiments, the processor 801 is configured to control sensing, acquisition and analysis of the sensing data provided by the sensor 811. In some embodiments, the processor 801 is configured to control the operations of the semiconductor fabrication system 100 for performing exhaust gas cleaning through the controller 813, The controller 813 may be similar to the controller 126.

The network interface 803 is configured to access program instructions and data accessed by the program instructions stored remotely through a network (not shown). In some embodiments, the network interface 803 connects the processor 801 to the parts of the lithography apparatus. In some embodiments, the network interface 803 connects the lithography apparatus to external devices.

The I/O device 805 includes an input device and an output device configured for enabling user interaction with the system 800. In some embodiments, the input device comprises, for example, a keyboard, a mouse, a trackball, a touchpad, a fingerprint sensor, and other devices. Moreover, the output device comprises, for example, a display, a printer, and other devices.

The storage device 807 is configured for storing program instructions and data, e.g., the recipe data, the pollutant list data, the exhaust sensing data or weather forecast data, accessed by the program instructions. In some embodiments, the storage device 807 comprises a non-transitory computer readable storage medium, for example, a magnetic disk and an optical disk.

The memory 809 is configured to store program instructions to be executed by the processor 801 and data accessed by the program instructions. In some embodiments, the memory 809 comprises any combination of a random-access memory (RAM), some other volatile storage device, a read only memory (ROM), and some other non-volatile storage device.

Some embodiments of the present disclosure provide a system. The system includes a semiconductor apparatus configured to process a workpiece and a particle separator configured to receive an exhaust gas generated by the semiconductor apparatus. The particle separator includes a mist generator configured to generate a mist and a first fan comprising a plurality of blades, wherein each of the plurality of blades includes holes allowing the exhaust gas and the mist to pass through.

Some embodiments of the present disclosure provide a particle separator. The particle separator includes an input channel configured to receive an exhaust gas generated by a semiconductor apparatus and a first fan configured to filter particles in the exhaust gas, wherein the first fan including a plurality of blades and each of the plurality of blades including holes. The particle separator further includes a second fan configured to generate an airflow to draw the exhaust gas out of the particle separator, and a mist dispenser extending in the input channel and configured to dispense a mist into the first fan.

Some embodiments of the present disclosure provide a method. A workpiece is processed in a semiconductor apparatus, the processing generating an exhaust gas. The exhaust gas is exhausted from the semiconductor apparatus to a particle separator, wherein the particle separator includes a first fan having a central chamber and a plurality of blades having holes, A mist is dispensed into the central chamber to mix with the exhaust gas. The first fan is rotated while the mist is dispensed to permit mixing of the exhaust gas with the mist between the central chamber and a periphery of the particle separator.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing front the spirit and scope of the present disclosure.

What is claimed is:

1. A system, comprising:

a semiconductor apparatus adapted to process a workpiece; and a particle separator adapted to receive an exhaust gas generated by the semiconductor apparatus, the particle separator comprising:

a mist generator adapted to generate a mist;

a first fan comprising a plurality of blades, wherein each of the plurality of blades includes holes allowing the exhaust gas and the mist to pass through; and an inner mesh member defining a central chamber of the particle separator, wherein the plurality of blades are coupled to the inner mesh member and adapted to rotate about the central chamber.

2. The system of claim 1, wherein the particle separator further comprises a second fan adapted to generate an airflow to draw the exhaust gas and the mist out of the particle separator.

3. The system of claim 2, wherein the second fan is arranged downstream of the first fan.

4. The system of claim 1, wherein the inner mesh member comprises holes, and the mist is adapted to flow into spaces between the plurality of blades through the holes of the inner mesh member.

5. The system of claim 4, wherein the mist generator extends into the central chamber.

6. The system of claim 4, wherein the particle separator further comprises an upper cover and a lower cover on two sides of the particle separator, wherein the lower cover defines an opening that permits the exhaust gas to flow into the particle separator.

7. The system of claim 1, wherein the particle separator further comprises an outer mesh member at a periphery of the particle separator and laterally surrounding the plurality of blades.

8. The system of claim 7, wherein the outer mesh member comprises holes, wherein the exhaust gas is adapted to flow out of the particle separator through the holes of the outer mesh member.

9. The system of claim 1, wherein the particle separator further comprises a pipe adapted to drain a liquid condensed from the mist in the first fan.

10. The system of claim 1, further comprising a processor adapted to determine at least one of a rotation speed of the first fan and a flow rate of the mist generator according to at least one of an operation type performed by the semiconductor apparatus, a material list of the operation type, an operation recipe of the operation type, a particle mass concentration of the exhaust gas and weather forecast data.

11. The system of claim 1, wherein the holes have a size between about 0.5 mm and about 3 mm.

12. The system of claim 1, wherein the mist has a droplet size in a range between about 20 μm and about 100 μm.

13. A system, comprising:

a semiconductor apparatus adapted to generate an exhaust gas during an operation; and a particle separator comprising:

a first fan adapted to filter particles in the exhaust gas, the first fan comprising a plurality of blades, each of the plurality of blades including holes;

a mist dispenser extending in the first fan and adapted to dispense a mist into the first fan; and an inner mesh member defining a central chamber of the particle separator, wherein the plurality of blades are coupled to the inner mesh member and adapted to rotate about the central chamber.

14. The system of claim 13, further comprising an upper cover and a lower cover on two sides of the particle separator, wherein each of the plurality of blades comprises a plurality of scramblers arranged in parallel and extending from the upper cover to the lower cover.

15. The system of claim 14, wherein each of the scramblers are arranged in a curved line from a top-view perspective.

16. The system of claim 13, further comprising a second fan adapted to generate an airflow to draw the exhaust gas out of the particle separator.

17. The system of claim 13, wherein the holes of one of the plurality of blades are arranged in a staggered manner.

18. A system, comprising:

a semiconductor apparatus adapted to generate an exhaust gas during an operation; and a particle separator comprising:

a first fan adapted to filter particles in the exhaust gas and comprising a plurality of blades, each of the plurality of blades including holes;

a mist dispenser adapted to dispense a mist into the first fan; and an inner mesh member defining a central chamber of the particle separator, wherein the plurality of blades are coupled to the inner mesh member and adapted to rotate about the central chamber.

19. The system of claim 18, further comprising an exhaust duct adapted to deliver the exhaust gas from the first fan to an external environment.

20. The system of claim 18, further comprising a chamber channel arranged over the first fan and adapted to allow the exhaust gas from the first fan to flow through, the chamber channel overlapping an axis of the first fan from a top-view perspective.

* * * * *